(12) United States Patent
Burch et al.

(10) Patent No.: US 11,640,328 B2
(45) Date of Patent: May 2, 2023

(54) PREDICTING EQUIPMENT FAIL MODE FROM PROCESS TRACE

(71) Applicant: PDF Solutions, Inc., Santa Clara, CA (US)

(72) Inventors: Richard Burch, McKinney, TX (US); Kazuki Kunitoshi, Chiba-ken (JP)

(73) Assignee: PDF Solutions, Inc., Santa Clara, CA (US)

( * ) Notice: Subject to any disclaimer, the term of this patent is extended or adjusted under 35 U.S.C. 154(b) by 0 days.

(21) Appl. No.: 17/383,334

(22) Filed: Jul. 22, 2021

(65) Prior Publication Data

US 2022/0027230 A1 Jan. 27, 2022

Related U.S. Application Data

(60) Provisional application No. 63/055,893, filed on Jul. 23, 2020.

(51) Int. Cl.
*G06F 11/07* (2006.01)
*G01R 31/28* (2006.01)

(52) U.S. Cl.
CPC ........ *G06F 11/079* (2013.01); *G06F 11/0706* (2013.01); *G06F 11/0793* (2013.01); *G01R 31/2831* (2013.01)

(58) Field of Classification Search
CPC ............. G01R 31/2831; G06F 11/0706; G06F 11/079; G06F 11/0793
See application file for complete search history.

(56) References Cited

U.S. PATENT DOCUMENTS

| 8,046,637 | B2* | 10/2011 | Gross ................ G06F 11/0724 714/37 |
| 9,298,538 | B2* | 3/2016 | Marvasti ............. G06F 11/0706 |
| 9,952,921 | B2* | 4/2018 | Kim ...................... G06F 11/079 |
| 10,275,303 | B2* | 4/2019 | Patra .................. G06F 11/0787 |
| 2006/0259198 | A1* | 11/2006 | Brcka ................ G05B 23/0254 700/246 |
| 2018/0025483 | A1 | 1/2018 | Finlay et al. |
| 2018/0294174 | A1* | 10/2018 | Fujikata ............ H01L 21/67288 |
| 2020/0104639 | A1 | 4/2020 | Didari et al. |

FOREIGN PATENT DOCUMENTS

WO    WO-2013072232 A1 *  5/2013   .......... G06F 11/0709

OTHER PUBLICATIONS

International Search Report and Written Opinion of the ISA dated Oct. 26, 2021.

* cited by examiner

*Primary Examiner* — Joseph R Kudirka
(74) *Attorney, Agent, or Firm* — Dergosits & Noah LLP

(57) ABSTRACT

A predictive model for equipment fail modes. An anomaly is detected in a collection of trace data, then key features are calculated. A search is conducted for the same or similar anomalies having the same key features in a database of past trace data. If the same anomaly occurred before and is in the database, then the type of anomaly, its root cause, and action steps to correct can be retrieved from the database.

7 Claims, 5 Drawing Sheets

200

|  |  | Predicted Class | | | |
|---|---|---|---|---|---|
|  |  | Normal | Type1 | Type2 | Type1&2 |
| Reviewed Class | Normal | 186 | 0 | 0 | 0 |
| | Type1 | 0 | 5 | 0 | 0 |
| | Type2 | 0 | 0 | 7 | 0 |
| | Type1&2 | 0 | 0 | 1 | 1 |

FIG. 3

PREDICTING EQUIPMENT FAIL MODE FROM PROCESS TRACE

CROSS REFERENCE

This application claims priority from U.S. Provisional Application No. 63/055,893 entitled Multi-variate, Multi-sensor prediction of Equipment Fail Mode from Sensor Trace Data, filed Jul. 23, 2020, and incorporated herein by reference in its entirety.

TECHNICAL FIELD

This application relates to the use of process trace analysis for detection and classification of semiconductor equipment faults, and more particularly, to machine-based methods for predicting an equipment fail mode.

BACKGROUND

Effective process control for semiconductor manufacturing applications is critical for improving reliability and reducing field failures. One approach to process control is fault detection and classification ("FDC"), where the focus is on monitoring as many as several thousand equipment sensors installed in process equipment as a means to quickly identify and correct process instability. However, one of the key challenges in using FDC techniques to drive a rapid response to equipment problems is the identification of the root cause for detected process trace anomalies.

The detection of equipment faults by monitoring time-series traces of equipment sensors is a long-recognized but very difficult problem in semiconductor manufacturing. Typically, an FDC method starts with breaking a complex trace into logical "windows" and then computing statistics (frequently called indicators or key numbers) on the trace data in the windows. The indicators can be monitored using statistical process control ("SPC") techniques to identify anomalies, based primarily on engineering knowledge, and the indicators can be utilized as inputs for predictive models and root cause analysis. The quality of the indicators determines the value of all subsequent analysis. High quality indicators require high quality windows. However, the analysis of the indicators for anomaly detection is still primarily univariate in nature, with anomalies considered on a feature by feature basis, and is generally insufficient to identify equipment fail modes related to the detected anomaly.

Thus, it would be desirable to improve the ability of anomaly detection systems to identify equipment fail modes, for example, through multivariate analysis of trace data.

DESCRIPTION OF DRAWINGS

FIG. 3 is a table with summary results for the traces shown in FIGS. 1 and 2.

DETAILED DESCRIPTION

As used herein, the term "sensor trace" refers to time-series data measuring an important physical quantity periodically during operation of a piece of semiconductor processing equipment, e.g., the sampled values of a physical sensor at each time point. The sampling rate can vary and the time period between samples is not always the same. The term "trace" or "equipment trace" refers to a collection of sensor traces for all the important sensors identified for a particular processing instance. The term "step" refers to a distinct device processing period, e.g., one of the steps in a process recipe.

Disclosed herein is a predictive model for equipment fail modes. The model detects and identifies a current anomaly in trace data, calculates key features associated with the current anomaly, and searches for anomalies having those key features in a database of past trace data. If the same or similar anomalies are found in the past trace data, a likelihood can be determined as to whether or not the current anomaly can be accurately classified in accordance those past anomalies; e.g., the current anomaly is most like a prior anomaly in the past trace data. If so, then the type of anomaly, its root cause, and action steps to correct can likely be retrieved from the database of past trace data. If not, however, then the model returns an error, meaning it has not seen that anomaly before. The anomaly and its features will nevertheless be stored for future reference; and the database updated if a root cause and corrective actions are thereafter determined.

Figure 1:
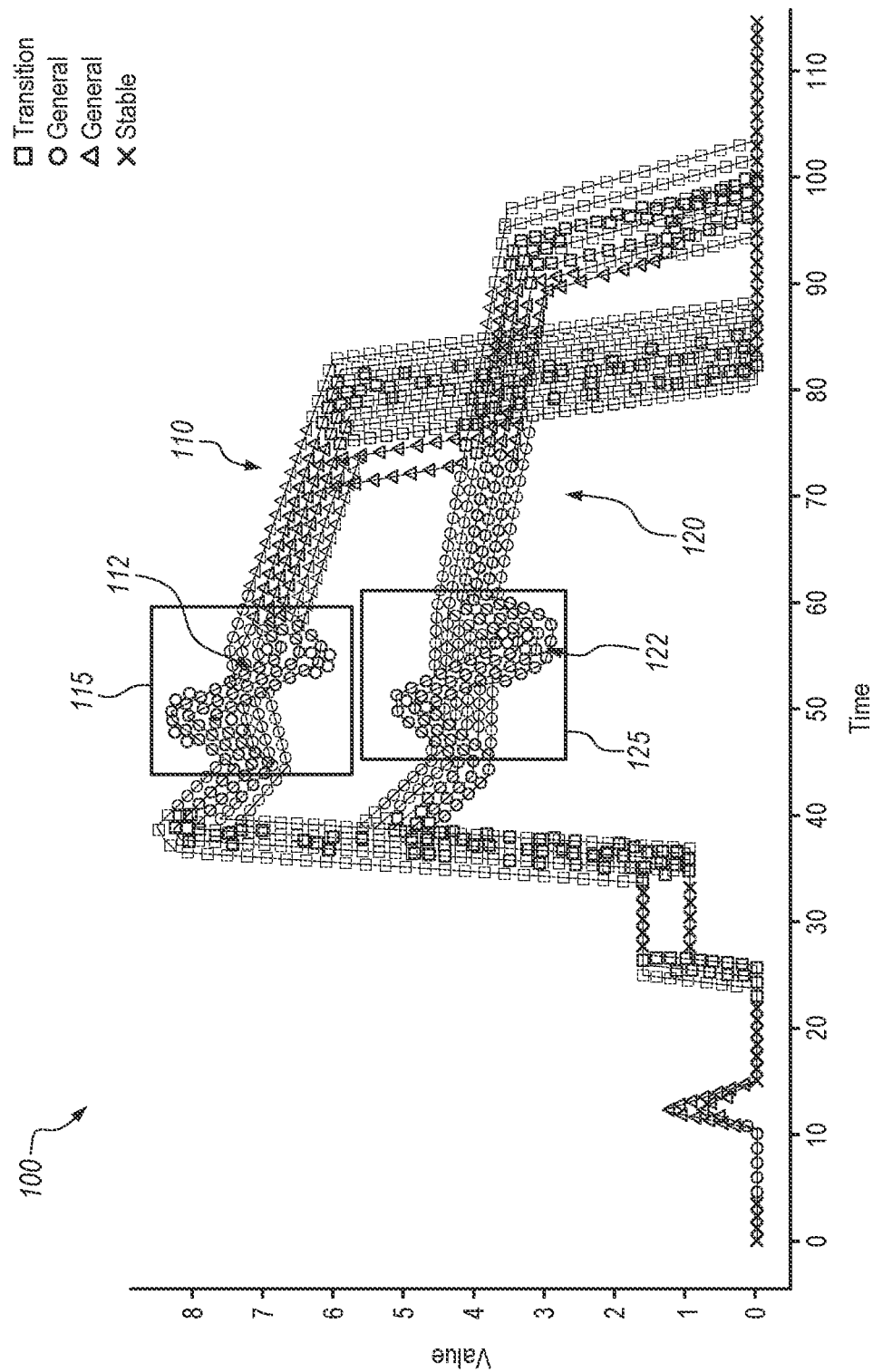
FIG. 1 is a process display interface illustrating a graphical collection of equipment sensor traces, with a first set of windows defined for a first type of anomalous traces.

Referring to FIG. 1, an exemplary graph 100 of trace data is illustrated representing approximately two hundred individual traces, i.e., time-series values obtained from individual sensors taken during distinct steps of a semiconductor fabrication process run for producing semiconductor wafers. Sensor values are plotted on the y-axis and time in seconds is measured on the x-axis. It should be recognized that while process steps normally start at a specific point in time, the length of a process step may be variable.

For most of the period between approximately 40-90 seconds, normal process operation is expected to yield trace data that is gradually falling off and is therefore relatively stable and consistent. However, in this case, between approximately 45-60 seconds, a first set of traces 112 in the top grouping of traces 110 and a second set of traces 122 in the bottom set of traces 120 both show sensor readings that suddenly spike up in value, then down, then back up, and then settle back into the gradual falling off pattern. This trace behavior is unexpected and indicates some kind of problem with the process. Thus, in order to analyze the anomalous behavior, windows 115 and 125 are defined over these Type I anomaly regions in the top group 110 and the bottom group 120, respectively, of the graph 100 where the unexpected Type I anomalies occur for some number of wafers.

Figure 2:
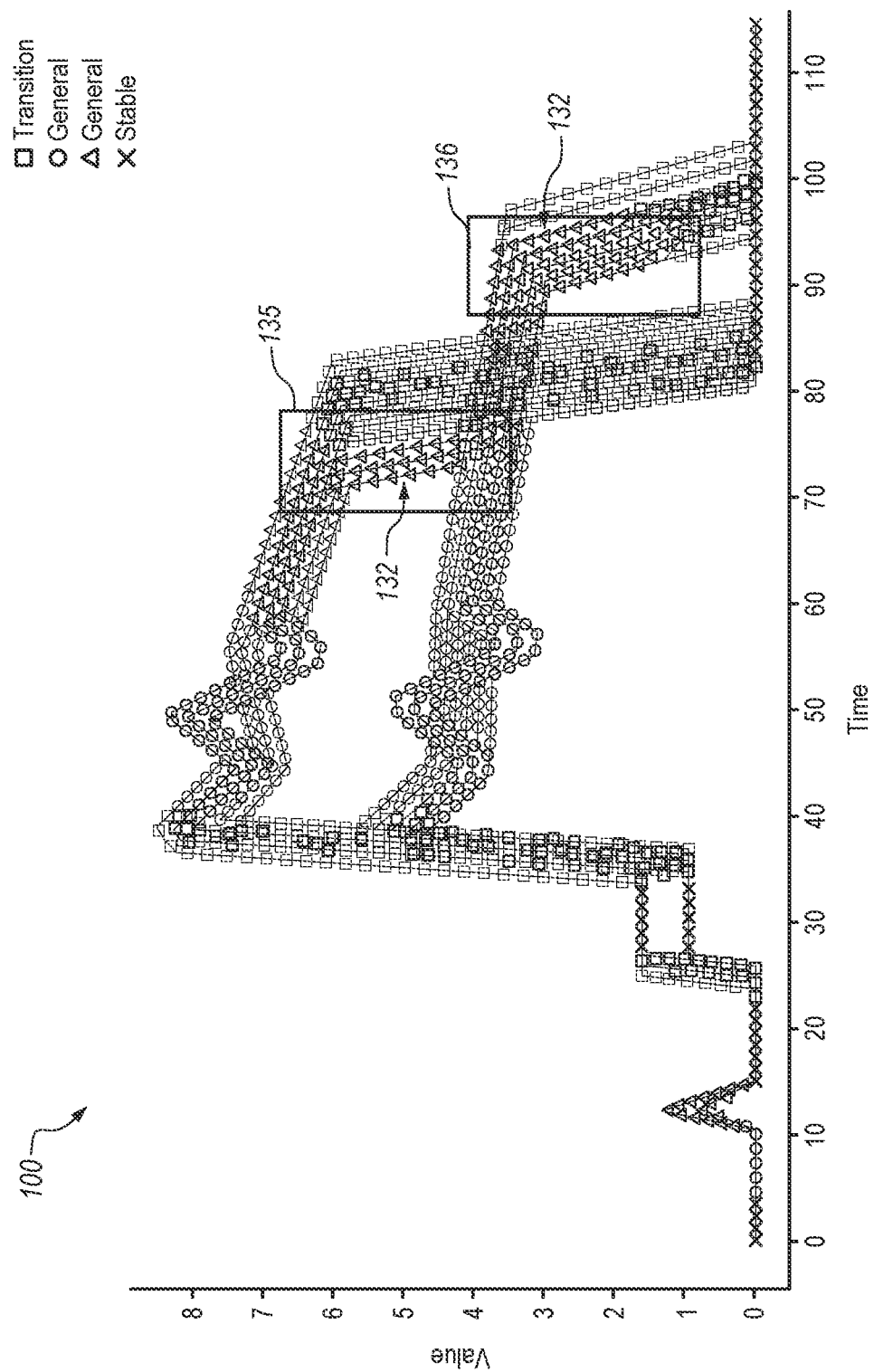
FIG. 2 is the process display interface of FIG. 1, with a second set of windows defined for a second type of anomalous traces in a different region of the sensor traces.

FIG. 2 shows the same graph 100 of trace data, but with the focus on a different portion of the trace data where a Type II anomaly is occurring for a third set of traces 132 only in the top group 110. In this case, some of the traces appear to fall off early, then straighten out, then fall off again, then straighten out again, before falling all the way to nominal as expected. Thus, for analyzing this type of anomalous behavior, window 135 is defined over the first falling off region in the top group of traces 110 and window 136 is defined over the second falling off region in the top group.

Typically, technical staff manually establish windows for analyzing particular regions of the trace data based simply on a visual review of the graphical results, generally looking to define windows for stable process operation manually where (i) the trace data is consistent, and/or (ii) the rate of change is the same. Regions where the trace data is changing rapidly in value or rate of change are considered to be transition windows and will be generally be located between a pair of stable windows. However, anomalies such as the Type I and Type II anomalies described as examples herein may appear in otherwise normal stable windows of the trace data, as illustrated in FIGS. 1 and 2, and be selected for processing and analysis through windowing the relevant region(s).

A machine learning model is configured to detect anomalies using known methods including use of the data from window analysis. For example, a combination of wafer attributes and trace location features may be provided as inputs to a simple multi-class machine learning model, such as a gradient-boosting model, that is trained on datasets to detect anomalous behavior in the trace data. However, once the anomaly is detected, it is important to know if the same anomaly has occurred before, and if so, what caused it, and what actions steps should be taken to correct the issue.

After definition of anomaly windows 115, 125, 135 and 136, indicators are calculated from the traces in each of the windows. The indicators are then stored as features associated with the window and the instance of trace data on those wafers, along with selected wafer attributes and the anomaly location in the trace. Feature engineering and selection can be performed to narrow a set of features to those key features determined to be most important to detecting and identifying the particular anomaly with the detection model.

For the Type I and Type II anomalies illustrated in FIGS. 1 and 2, respectively, the predicted classifications from the detection model (including normal wafers) are summarized in the table 200 of FIG. 3, where five wafers have the anomalies identified as the Type I anomaly; seven wafers have the anomalies identified as the Type II anomaly; and one wafer has both the Type I and Type II anomalies. Despite the small number of detected anomalies, it is important to identify and characterize anomalies, particularly for use in training a predictive model to monitor trace data so as to minimize instances of process instability that may lead to defective wafers.

For each type of anomaly, with the key features as inputs to the model, the model is also configured for (i) searching a database of prior trace data for the same or similar anomaly, and (ii) either identifying one or more prior anomalies as most like the current anomaly, or indicating there is nothing like the current anomaly in the database.

If the same or similar anomalies are found in the database of past trace data, then its root cause and the action steps taken to correct the anomalous behavior are likely also stored in the database and can be retrieved for comparison to the current anomaly. By comparing the features and patterns of the anomalies, the model makes a determination of the likelihood that the current trace anomaly is most like one or more similar or same anomalies observed in past traces. If the likelihood exceeds a threshold, then the anomaly is classified, and prior knowledge regarding the root cause and corrective action is retrieved from the database.

Figure 4:
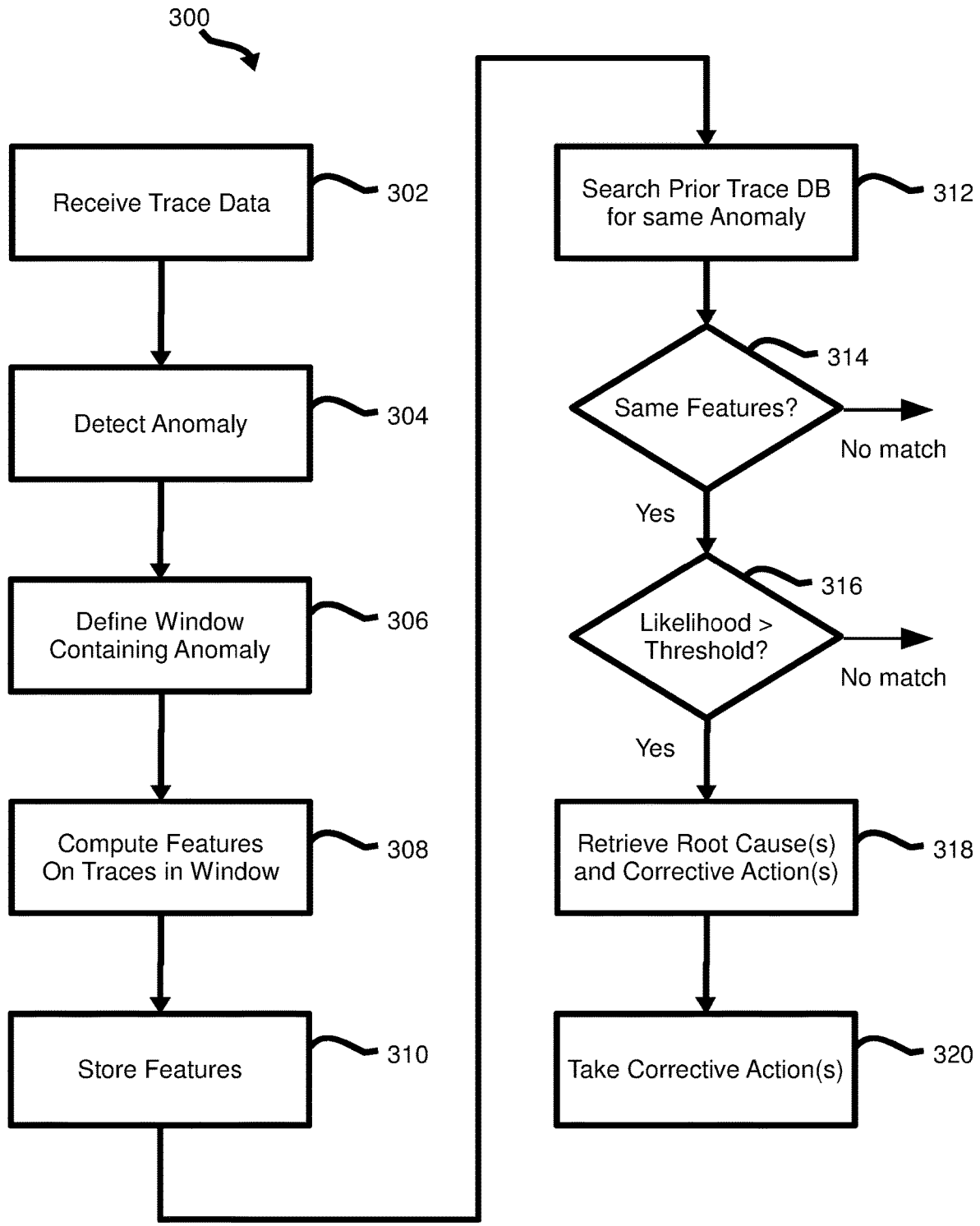
FIG. 4 is a flow chart illustrating one embodiment of a process for predicting an equipment fail mode.

This process is summarized graphically in FIG. 4, which illustrates one embodiment of a process 300 for identifying a root cause for an anomaly. In step 302, trace data is received into a predictive model and processed. In step 304, at least one anomaly is detected in the received trace data and its location in the trace identified. A window is then defined in step 306 to contain the portion of the traces that include the anomaly, and features of the anomalous trace are calculated, including statistics, in step 308 and stored in step 310. Searches are then conducted in a database having past trace data in step 312 for anomalies having the same features associated with the current anomaly. If the same or similar anomalies are found in the past trace data in step 314, a likelihood can be determined in step 316 as to whether or not the current anomaly can be accurately classified in accordance those past anomalies. If so, then in step 318, the type of anomaly, its root cause, and action steps to correct can be retrieved from database for the same or similar the past occurrences, and appropriate corrective action taken in step 320. If not likely, however, then the model returns an error, meaning it has not seen that anomaly before. The anomaly and its features will nevertheless be stored for future reference; and the database updated if a root cause and corrective actions are thereafter determined.

Figure 5:
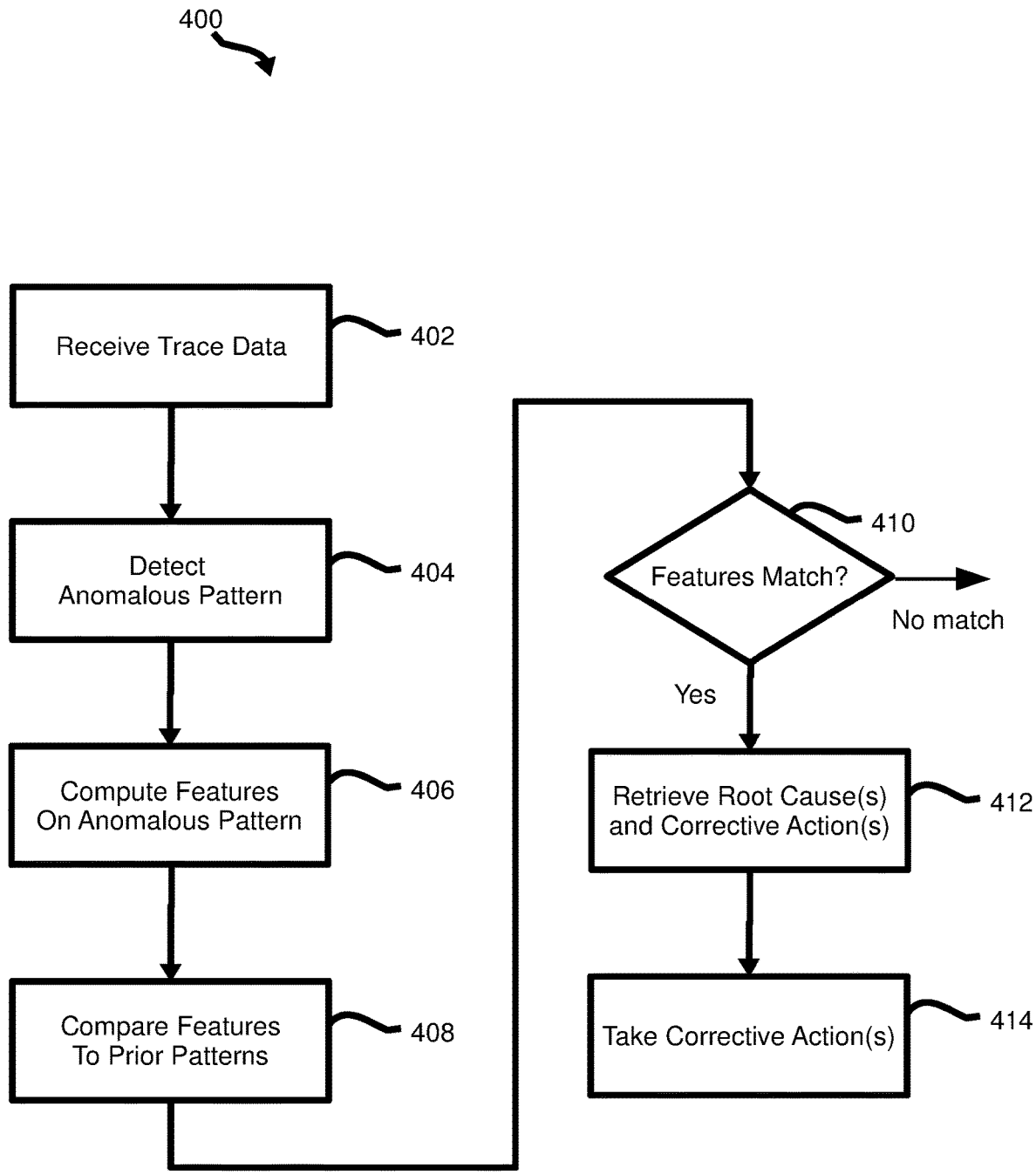
FIG. 5 is a flow chart illustrating another embodiment of a process for predicting an equipment fail mode.

FIG. 5 presents a more generalized approach in process 400. In step 402, trace data is received into a predictive model and processed. In step 404, an anomalous pattern is detected in the trace data. In step 406, features of the detected anomalous pattern are computed and in step 408 compared to features of prior anomalous patterns stored in a database of past trace data. In step 410, if a features match is determined, then in step 412, information regarding the anomalous pattern from past trace data is retrieved from the database, including one or more root causes for the anomaly as well as corrective actions for the root causes. In step 414, appropriate corrective action is taken.

The multi-variate analysis of trace data is facilitated by the emergence of parallel processing architectures and the advancement of machine learning algorithms which allow users to gain insights and make predictions using massive amounts of data at speeds that make such approaches relevant and realistic. Machine learning is a branch of artificial intelligence that involves the construction and study of modeled systems that can learn from data. These types of ML algorithms, and along with parallel processing capabilities, allow for much larger datasets to be processed, and are much better suited for engaging in multivariate analysis. Further, an effective machine learning approach to anomalous trace detection and classification should facilitate active learning and use the information gained to continuously improve the accuracy of both fault detection and classification.

The creation and use of processor-based models for trace analysis can be desktop-based, i.e., standalone, or part of a networked system; but given the heavy loads of information to be processed and displayed with some interactivity, processor capabilities (CPU, RAM, etc.) should be current state-of-the-art to maximize effectiveness. In the semiconductor foundry environment, the Exensio® analytics platform is a useful choice for building interactive GUI templates. In one embodiment, coding of the processing routines may be done using Spotfire® analytics software version 7.11 or above, which is compatible with Python object-oriented programming language, used primarily for coding machine language models.

The foregoing description has been presented for the purpose of illustration only—it is not intended to be exhaustive or to limit the disclosure to the precise form described. Many modifications and variations are possible in light of the above teachings.

The invention claimed is:

1. A method, comprising:
    receiving into a computer-based machine learning model equipment trace data from a plurality of semiconductor equipment sensors during a plurality of steps in a semiconductor process;
    detecting by the machine learning model a first anomaly in the equipment trace data, the first anomaly having an associated location within the equipment trace data;
    defining by the machine learning model a window containing a period of time of the equipment trace data including the first anomaly;
    calculating by the machine learning model statistics on the period of the equipment trace data in the window;
    storing in memory the calculated statistics and the associated location of the first anomaly as a plurality of key features associated with the first anomaly;
    searching through a database of past trace data by providing the plurality of key features of the first anomaly as inputs to the machine learning model configured to find past trace data having the plurality of key features;
    determining by the machine learning model that an instance of the past trace data has the plurality of key features of the first anomaly;
    identifying by the machine learning model a root cause for the instance of the past trace data having the key features of the first anomaly; and
    taking an action to correct the root cause in the semiconductor process.

2. The method of claim 1, further comprising:
    retrieving the root cause and a corrective action for the root cause from the database.

3. The method of claim 1, wherein the determining step further comprises:
    determining by the machine learning model a likelihood that the instance of the past trace data in the database has the key features of the first anomaly; and
    retrieving the root cause if the likelihood exceeds a threshold.

4. The method of claim 3, wherein the step of retrieving a root cause further comprises:
    retrieving a corrective action for the root cause from the database.

5. A method for predicting semiconductor processing equipment failure, comprising:
    detecting, by a processor including a machine-learning model trained to detect anomalies in sets of trace data using multivariate analysis, a first anomalous pattern in a first set of traces obtained from a plurality of semiconductor equipment sensors during a plurality of steps in a semiconductor process;
    identifying, by the processor, a time-period window that contains the first anomalous pattern in the first set of traces;
    calculating, by the processor using multivariate analysis, a plurality of features from the first set of traces located within the window;
    searching, by the processor, a database of past trace data;
    identifying, by the processor, at least one set of past trace data in the database having the plurality of features in an associated anomalous pattern;
    determining, by the processor using multivariate analysis of the plurality of features in the associated anomalous pattern, a likelihood that the associated anomalous pattern of the at least one set of past trace data is the same as the first anomalous pattern;
    retrieving, by the processor, a root cause for the at least one prior anomalous pattern from the database if the likelihood exceeds a threshold; and
    taking an action to correct the root cause in the semiconductor process.

6. The method of claim 5, the step of identifying a time-period window further comprising:
    defining the time-period window as a region where the values in the first set of traces are changing rapidly.

7. The method of claim 5, the step of identifying a time-period window further comprising:
    defining the time-period window as a region where the rate of change of values in the first set of traces is changing rapidly.

* * * * *